(12) United States Patent
Daniel

(10) Patent No.: US 10,541,605 B2
(45) Date of Patent: Jan. 21, 2020

(54) CHARGE PUMP SYSTEM INCLUDING OUTPUT EFFICIENCY CONTROL

(71) Applicant: Intel Corporation, Santa Clara, CA (US)

(72) Inventor: Marcin Daniel, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/217,878

(22) Filed: Dec. 12, 2018

(65) Prior Publication Data

US 2019/0123639 A1    Apr. 25, 2019

(51) Int. Cl.
*H02M 3/07*    (2006.01)
*H03K 17/693*    (2006.01)
*H02M 1/00*    (2006.01)

(52) U.S. Cl.
CPC ............ *H02M 3/07* (2013.01); *H03K 17/693* (2013.01); *H02M 2001/0009* (2013.01); *H02M 2001/0025* (2013.01)

(58) Field of Classification Search
CPC ........................................................ H02M 3/07
USPC ................................................. 327/536, 103
See application file for complete search history.

(56) References Cited

U.S. PATENT DOCUMENTS

| 8,497,670 | B1* | 7/2013 | Molin | H02M 3/07 |
| | | | | 323/293 |
| 2006/0197583 | A1* | 9/2006 | Yen | H02M 3/07 |
| | | | | 327/536 |
| 2008/0143308 | A1* | 6/2008 | Hsieh | G05F 1/56 |
| | | | | 323/280 |

* cited by examiner

*Primary Examiner* — Tomi Skibinski
(74) *Attorney, Agent, or Firm* — Schwegman Lundberg & Woessner, P.A.

(57) ABSTRACT

Some embodiments include apparatuses having a charge pump to generate an output voltage based on a first supply voltage, a second supply voltage, and timing of a clock signal; an output regulator to generate a regulated voltage at a node based on the output voltage; and a monitor circuit to monitor an output current at the node and provide feedback information based on the output current in order to adjust a value of the second supply voltage.

19 Claims, 3 Drawing Sheets

US 10,541,605 B2

CHARGE PUMP SYSTEM INCLUDING OUTPUT EFFICIENCY CONTROL

TECHNICAL FIELD

Embodiments described herein pertain to supply power in integrated circuits. Some embodiments relate to charge pump circuitry.

BACKGROUND

Charge pumps are commonly used electronic devices to generate a higher supply voltage from a lower supply voltage. Many conventional charge pumps have techniques to improve charge pump efficiency relative to output current by reducing the operating frequency of the charge pump (so called clock-skipping technique). Such conventional techniques can deteriorate the quality of the output voltage of the charge pump in terms of output voltage ripple and noise performance. Therefore, such conventional charge pumps are unfavorable for use in systems that are noise-sensitive.

DETAILED DESCRIPTION

The techniques described herein involve a feedback mechanism built into a charge pump system. The charge pump system includes a charge pump that can be part of a voltage generator. The feedback mechanism can monitor output current of the charge pump system and generate feedback information, which can include a reference voltage. The described techniques use the reference voltage to adjust one of the supply voltages used by the charge pump. The adjustment can reduce the power losses related to the switching of the charge pump without sacrificing the quality of the output voltage in terms of noise and ripples. The adjustment improves the efficiency of the charge pump in some operating conditions of a load that uses power from the charge pump. Other improvements and benefits of the described techniques are discussed below. The described techniques can be used in many systems where noise sensitivity is a factor.

Figure 1:
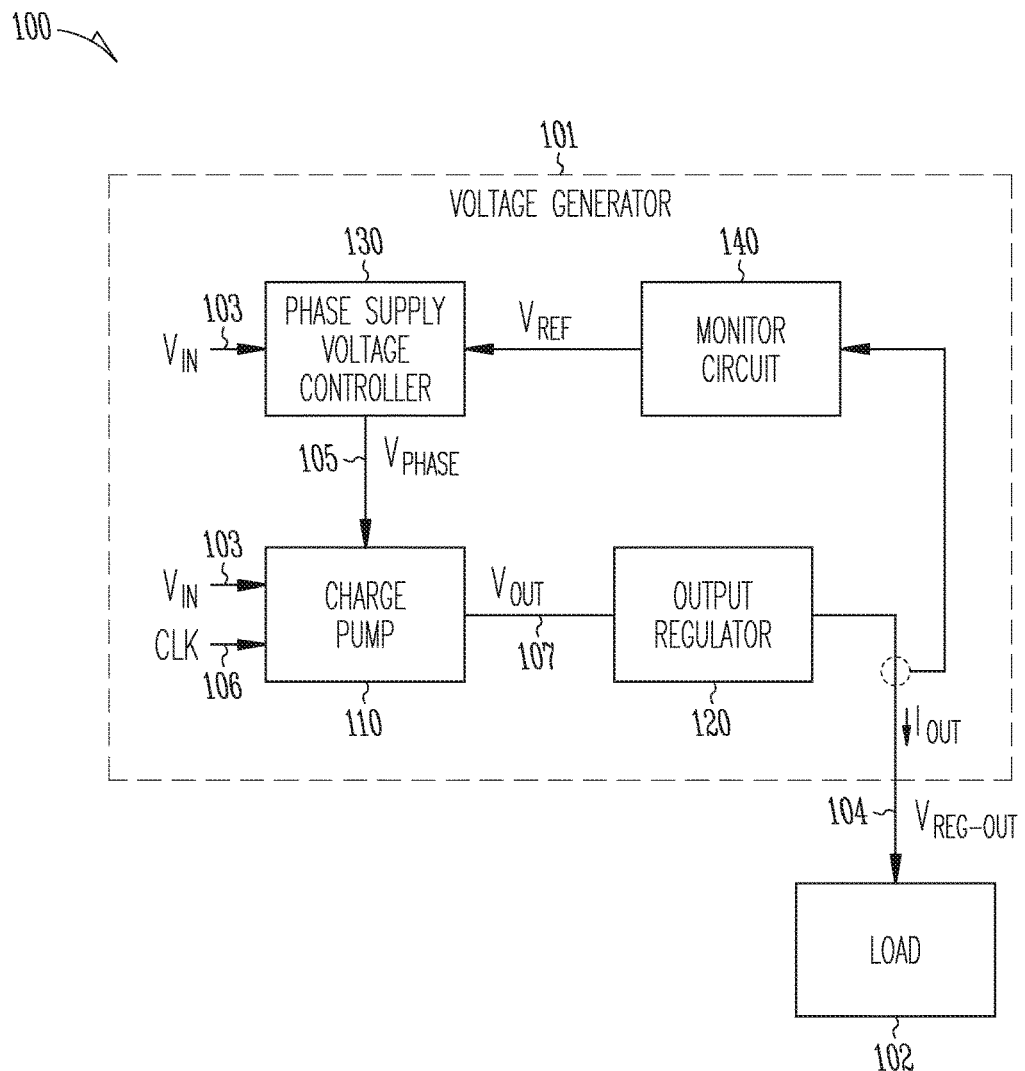
FIG. 1 shows an apparatus including a voltage generator and a load, according to some embodiments described herein.

FIG. 1 shows an apparatus 100 including a voltage generator 101 and a load 102, according to some embodiments described herein. Apparatus 100 can include or be included in an electronic device or systems. Examples of such devices or systems include computers (e.g., servers, desktops, laptops, and notebooks), tablets, cellular phones, wearable electronic things, Internet of Things (IoT), an integrated circuit chip (e.g., a processor), and other electronic devices or systems.

As shown in FIG. 1, apparatus 100 can include a node (e.g., supply power node) 103 to receive a voltage (e.g., input supply voltage) $V_{IN}$ and a node (e.g., regulator output node) 104 to provide a voltage (e.g., a regulated output voltage) $V_{REG\_OUT}$. Supply power node 103 can be part of a supply power rail (e.g., $V_{DD}$ power rail) of apparatus 100 that can receive supply power from a battery (not shown) through a power path coupled to the battery. Such a power path may include circuitry (e.g., supply voltage regulating circuitry, not shown in FIG. 1) to receive supply power from the battery and generate a voltage, which can include voltage $V_{IN}$.

As shown in FIG. 1, voltage generator 101 can include a charge pump 110 that can receive voltages (e.g., supply voltages) $V_{IN}$ and $V_{PH}$ and a clock signal CLK at nodes 103, 105, and 106, respectively. Charge pump 110 can include stages that can operate based on timing (e.g., phases) of clock signal CLK to generate a voltage (e.g., output voltage) $V_{OUT}$ at node 107 based on voltages $V_{IN}$ and $V_{PH}$.

Charge pump 110 can use voltage $V_{IN}$ for some of its components to generate voltage $V_{OUT}$. Charge pump 110 can also use voltage $V_{PH}$ as supply voltage (e.g., phase voltage supply) for some other circuit components (e.g., switching circuit, not shown) of charge pump 110. Such other components can include transistors that may operate at an operating voltage (e.g., a maximum tolerance voltage) having a value less than the value of voltage $V_{IN}$. Thus, in addition to voltage $V_{IN}$, charge pump 110 may use voltage $V_{PH}$ (e.g., $V_{PH}<V_{IN}$) as a second supply for components of charge pump 110 that use a supply voltage having a value less than the value of voltage $V_{IN}$.

As shown in FIG. 1, voltage generator 101 can include an output regulator 120 to regulate voltage $V_{OUT}$ and generate a noise and ripple-free voltage (e.g., charge pump regulated output voltage) $V_{REG\_OUT}$ based on voltage $V_{OUT}$. Load 102 can use voltage $V_{REG\_OUT}$ as its supply voltage or as a voltage to control components (e.g., control the gates of switching transistors in load 102).

Load 102 can include or can be part of an electronic unit which may require low noise and low ripple supply (e.g., antenna signal path in transceiver part of a modem), transmitter, a receiver, or part of other types of electronic units. Load 102 may have different operational states that may include a higher power consumption state (e.g., active state) and a lower power consumption state (e.g., an inactive state, such as a sleep state). Load 102 may consume a relatively higher current in the higher power consumption state and a relatively lower current in the lower power consumption state. Current $I_{OUT}$ at node 104 can represent current provided to load 102. Thus, the value of current $I_{OUT}$ can be relatively high when load 102 is in the higher power consumption state and relatively low when load 102 is in the lower power consumption state.

Voltage generator 101 can include a phase supply voltage controller 130 that can operate to receive a voltage (e.g., a reference voltage) $V_{REF}$. Phase supply voltage controller 130 can control (e.g., adjust) the value of voltage $V_{PH}$ based on the value of voltage $V_{REF}$.

Voltage generator 101 can include a monitor circuit 140, which can operate to monitor current $I_{OUT}$ and generate voltage $V_{REF}$. The value of voltage $V_{REF}$ is based on the value of current $I_{OUT}$. For example, the value of voltage $V_{REF}$ can be proportional to the value of current $I_{OUT}$, such that the higher the value of current $I_{OUT}$ the higher the value of voltage $V_{REF}$, and the lower the value of current $I_{OUT}$ the lower the value of voltage $V_{REF}$.

Monitor circuit 140 can monitor current $I_{OUT}$ and generate feedback information, which can include voltage $V_{REF}$. As described above, phase supply voltage controller 130 can use voltage $V_{REF}$ to adjust the value of voltage $V_{PH}$.

As mentioned above and as described in more detail below, the techniques described herein involve mechanisms to improve the efficiency of a charge pump (e.g., charge pump 110) based on operating conditions of load 102. As mentioned above, the value of current $I_{OUT}$ can indicate the operating conditions of load 102. To optimize the efficiency of a charge pump 110 based on current $I_{OUT}$, the following description describes the efficiency of a charge pump (which can be a model for charge pump 110) based on current $I_{OUT}$ provided to a load and based on other parameters (e.g., circuit elements) associated with the charge pump.

Figure 2:
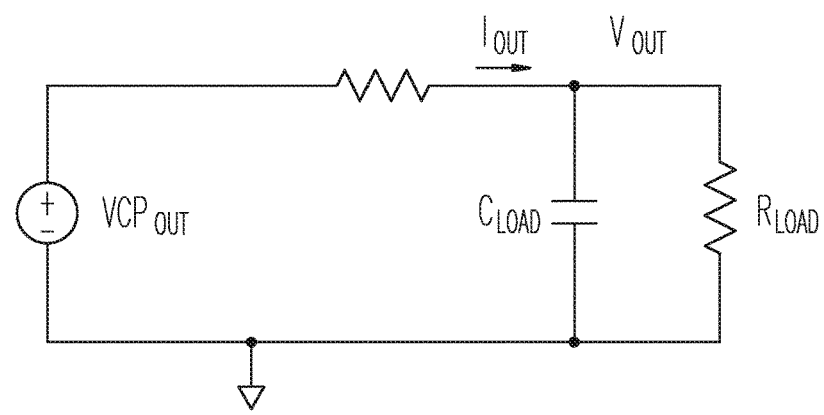
FIG. 2 shows an equivalent circuit of a charge pump of the voltage generator of FIG. 1, according to some embodiments described herein.

FIG. 2 shows an equivalent circuit of charge pump 110 of the voltage generator of FIG. 1, according to some embodiments described herein. As shown in FIG. 2, the equivalent circuit of charge pump 110 can be represented by a voltage source $VCP_{OUT}$ connected in series with an output resistance Rs. Capacitor $C_{LOAD}$ and resistor $R_{LOAD}$ represent a load (e.g., load 102 of FIG. 1) coupled to charge pump 110. Current $I_{OUT}$ and voltage $V_{OUT}$ represent current and voltage, respectively, provided to the load 102 from charge pump 110.

In FIG. 2, voltage $VCP_{OUT}$ represents the output voltage of charge pump 110. For simplicity, the following discussion assumes that voltage $VCP_{OUT}$ is an output voltage of a basic N-stage Dickson charge pump architecture where N=2. However, the following discussion can be applicable to Dickson charge pump architecture having more than two stages (e.g., N>2). For a 2-stage (N=2) Dickson charge pump architecture, voltage $VCP_{OUT}$ can be expressed as follows.

$$VCP_{OUT}=V_{IN}+2*[(C/(C+Cs))*V_{PH}-V_D]-V_D \quad (1)$$

In equation (1), symbol "*" represents multiplication and symbol "/" represents division, "C" represents the charge pump stage capacitance, "Cs" represents a stray capacitance related to a single charge pump stage, and "$V_D$" represents a threshold voltage of a diode. Voltages $V_{IN}$ and $V_{PH}$ represent input voltage (e.g., supply voltage (e.g., VDD)) and phase supply voltage, respectively, of charge pump 110, as described above with reference to FIG. 1.

Output resistance Rs of FIG. 2 can be expressed according to Dickson charge pump architecture as follows.

$$Rs=2/[(C+Cs)*fs] \quad (2)$$

In equation (2), "fs" is the frequency of clock signal CLK supplying the charge pump phases.

In FIG. 2, a ripple voltage $V_{RIPPLE}$ can occur in voltage $V_{OUT}$ and can be described in a simplified way as follows.

$$V_{RIPPLE}=V_{OUT}/(fs*R_{LOAD}*C_{LOAD}) \quad (3)$$

The effective output voltage (e.g., $V_{OUT}$) of charge pump 110 can be expressed as follows.

$$V_{OUT}=VCP_{OUT}-(Rs*I_{OUT}) \quad (4)$$

Based on equation (3), ripple voltage $V_{RIPPLE}$ depends inverse proportionally on frequency fs of clock signal CLK used by charge pump 110 and proportionally to voltage $V_{OUT}$ of charge pump 110.

The efficiency ($\eta$) of charge pump 110 can be defined as follows.

$$\eta=(V_{OUT}*I_{OUT})/(V_{OUT}*I_{OUT})+P\_res+P\_dyn \quad (5)$$

In equation (5), $V_{OUT}*I_{OUT}$ represents the output power of charge pump 110, and "P_res" and "P_dyn" represent resistive loss and dynamic loss (e.g., switching loss), respectively, and can be expressed as follows.

$$P\_res=Rs*I_{OUT}^2 \quad (6)$$

$$P\_dyn=k*N*fs*Cs*V_{PH}^2 \quad (7)$$

In equation (7), "k" is a coefficient of proportionality.

Combining equations (6) and (7) with equation (5) yields the generic representation of the charge pump efficiency as follows.

$$\eta=(V_{OUT}*I_{OUT})/(V_{OUT}*I_{OUT})+(Rs*I_{OUT}^2)+(k*N*fs*Cs*V_{PH}^2) \quad (8)$$

In some operating conditions, the load (e.g., load 102) may consume a relatively low power (e.g., low or medium current). Without the techniques described herein, the efficiency of charge pump 110 may be relatively low in such operation conditions due to low power delivered to the load, small resistive power losses, and dominant switching power losses. The techniques described herein help improve the efficiency of charge pump 110 in such operation conditions. As described in more detail below, the described techniques include a mechanism that can adjust and optimize a supply voltage (e.g., voltage $V_{PH}$) provided to charge pump 110 based on an output current (e.g., $I_{OUT}$). Further, optimizing the supply voltage (e.g., voltage $V_{PH}$) provided to charge pump 110 can also lead to optimizing of the power delivered to the load.

The techniques described herein include monitoring a load current (e.g., $I_{OUT}$) and generating feedback information to adjust the output voltage (e.g., $V_{OUT}$) of the charge pump to improve charge pump efficiency. As a result, the output voltage can be relatively stable and constant (e.g., ripple at the output voltage is minimized), independent of charge pump loading conditions (e.g., see equation (4)). This can improve charge pump efficiency such as by reducing the dynamic losses (e.g., switching losses) when the charge pump operates with a relatively low load current.

Referring to FIG. 1, charge pump 110 can generate voltage $V_{OUT}$ based on equations 1 and 4. Output regulator 120 can operate to regulate voltage $V_{OUT}$ to provide precise and ripple-free (or reduced ripple) voltage (e.g., $V_{REG\_OUT}$). The operation of output regulator 120 is beneficial from the noise and ripple performance point of view, as mentioned earlier. Current $I_{OUT}$ is monitored (e.g., sensed) by monitor circuit 140 and generate feedback monitor information (e.g., monitored information) that can include voltage $V_{REF}$. Phase supply voltage controller 130 uses voltage $V_{REF}$ to adjust the value of voltage $V_{PH}$. Based on equation (4) $V_{OUT}=VCP_{OUT}-(Rs*I_{OUT})$, it can be seen that the lower the value of current $I_{OUT}$ the higher the value of voltage $V_{OUT}$. Thus, the value of voltage $V_{OUT}$ can reach the value of voltage $VCP_{OUT}$ if the value of current $I_{OUT}$ is zero (e.g., at no load current or at a negligible amount of load current). The excess of voltage $V_{OUT}$ coming from a small value of $Rs*I_{OUT}$ can be compensated by lowering the value of voltage $VCP_{OUT}$ by means of a reduction in the value of voltage $V_{PH}$. With this reduction technique, the performance of voltage generator 101 can remain unchanged. However, the dynamic losses (e.g., switching losses) as described by equation (7) are reduced and overall charge pump efficiency increases. When the value of current $I_{OUT}$ increases, the value of voltage $V_{REF}$ increases. This in turn increases the value of voltage $V_{PH}$ in order to compensate for the voltage drop on resistor Rs, as described in equation (4). Thus, although the efficiency of charge pump 110 is improved in some operating conditions (e.g., at a relatively lower value of current $I_{OUT}$), efficiency improvement of charge pump 110 in some other operating conditions can be relatively less (e.g., at a relatively higher value of current $I_{OUT}$).

Figure 3:
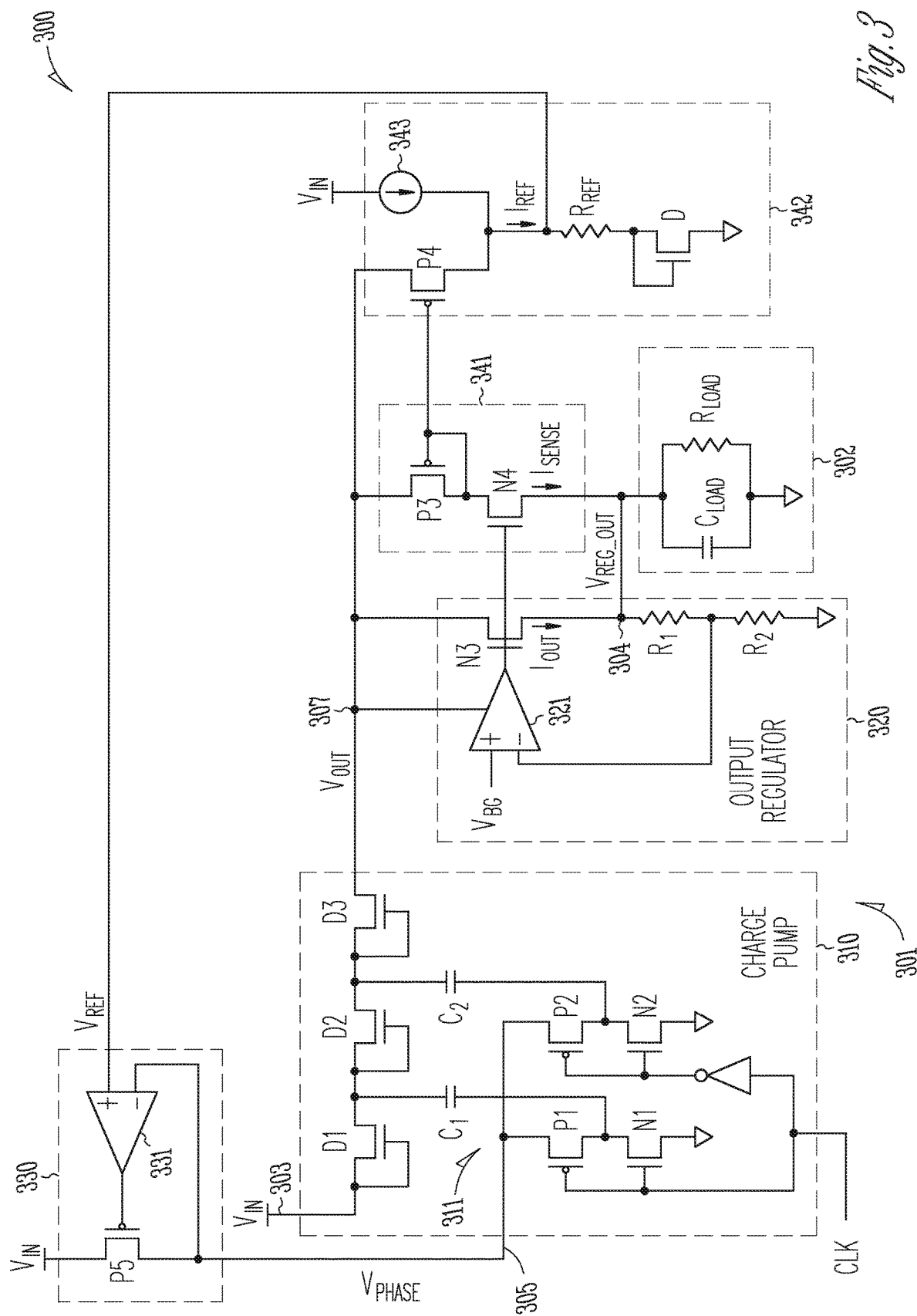
FIG. 3 shows a voltage generator, according to some embodiments described herein.

FIG. 3 shows an apparatus 300 including voltage generator 301 and a load 302, according to some embodiments described herein. Load 302 can include load 102 of FIG. 2 and can be represented by capacitor $C_{LOAD}$ and resistor $R_{LOAD}$ as shown in FIG. 3.

As shown in FIG. 3, voltage generator 301 can include a charge pump 310, an output regulator 320, a phase supply voltage controller 330, and a monitor circuit that includes a combination of a current sensor 341 and a current to voltage converter 342.

Charge pump 310 can include diodes D1, D2, and D3 coupled in series between nodes 303 and 307, capacitors C1 and C2, a switching circuit (e.g., phase driver circuit) 311 that includes transistors P1, P2, N1, and N2, and an inverter INV. Nodes 303 and 307 can be input and output nodes, respectively, of charge pump 310. Node 303 can receive voltage $V_{IN}$. Node 307 can provide voltage $V_{OUT}$. Switching circuit 311 can operate (e.g., turn on and turn off transistors P1, P2, N1, and N2) based on timing (e.g., the phases) of clock signal CLK. Charge pump 310 can include a node 305 to receive voltage $V_{PH}$, which can be used as supply voltage for switching circuit 311. The value of voltage $V_{PH}$ can be less than the value of voltage $V_{IN}$ (e.g., $V_{PH} < V_{IN}$).

Output regulator 320 can include an operational amplifier 321, a transistor N, and resistors R1 and R2. Output regulator 320 can generate voltage $V_{REG\_OUT}$ at a node (e.g., regulator output node) 304 based on voltage $V_{OUT}$ and a voltage $V_{BG}$ (e.g., a bandgap voltage). Output regulator 320 can also provide current Jour at node 304.

Phase supply voltage controller 330 can include a transistor P5 and an operational amplifier 331 that forms a voltage follower output circuit to generate voltage $V_{PH}$ based on voltage $V_{REF}$ (e.g., $V_{PH}=V_{REF}$ voltage).

Current sensor 341 can include transistors P3 and P4. Voltage converter 342 can include a transistor P4, a current source 343, a resistor $R_{REF}$, and a diode D.

In operation, switching circuit 311 can be part of two charge pump stages of charge pump 310. One stage of charge pump 310 can include transistors P1 and N1. Another stage of charge pump 310 can include transistors P2 and N2.

As shown in FIG. 3, transistors P1 and N1 have gates to receive clock signal CLK. Transistors P1 and N1 can form a driver (e.g., phase driver) that can operate (e.g., alternately turn on and turn off) to couple a plate (e.g., bottom plate) of capacitor C1 to either ground or node 305 based on the phases (e.g., signal levels) of clock signal CLK.

Transistors P2 and N2 have gates to receive clock signal (through inverter INV). Transistors P2 and N2 can form a driver (e.g., phase driver) that can operate (e.g., alternately turn on and turn off) to couple a plate (e.g., bottom plate) of capacitor C2 to either ground or node 305 based on the phases (e.g., signal levels) of clock signal CLK.

As show in FIG. 3, capacitor C1 can include a bottom plate directly coupled to an output node (node between transistors P1 and N1) of a driver that includes transistors P1 and N1. Capacitor C2 can include a bottom plate directly coupled to an output node (node between transistors P2 and N2) of a driver that includes transistors P2 and N2. In response to one phase (a "low" level) of clock signal CLK during operation of charge pump 310, the bottom plate of capacitor C1 can be coupled to node 305 (to voltage $V_{PH}$), and the bottom plate of capacitor C2 can be coupled to ground. In response to another phase (a "high" level) of clock signal CLK during operation of charge pump 310, the bottom plate of capacitor C1 can be coupled to ground, and the bottom plate of capacitor C2 can be coupled to node 305 (to voltage $V_{PH}$). The operation of switching circuit 311, capacitors C1 and C2, and diodes D1, D2, and D3 allow charge pump 310 to generate voltage $V_{OUT}$ that can have a value greater than the value of voltage $V_{IN}$ (e.g., $V_{OUT} > V_{IN}$). FIG. 3 shows an example of a positive charge pump 310. However, the techniques described herein can also be applicable to a negative charge pump (e.g., $V_{OUT} < V_{IN}$).

Output regulator 320 can include a source follower output stage (e.g., included in operational amplifier 321) to generate voltage $V_{REG\_OUT}$ based on voltages $V_{OUT}$ and $V_{BG}$. Voltage $V_{REG\_OUT}$ is the regulated voltage of $V_{OUT}$.

Current sensor 341 can operate to generate a current $I_{SENSE}$ based on current $I_{OUT}$. Current $I_{SENSE}$ can be a scaled down replica of current $I_{OUT}$. For example, the value of $I_{SENSE}$ can be less than the value of current $I_{OUT}$ by a factor X (e.g., $I_{SENSE}=I_{OUT}/X$, where X is a positive real number).

Current to voltage converter 342 can operate to convert a current $I_{REF}$ into a voltage $V_{REF}$. Current $I_{REF}$ can be a scaled down replica of current $I_{SENSE}$. For example, the value of $I_{REF}$ can be less than the value of current $I_{SENSE}$ by a factor M (e.g., $I_{REF}=I_{SENSE}/M$, where M is a positive real number). In FIG. 3, transistors P3 and P4 can be arranged to form a current mirror circuit such that $I_{REF}=I_{SENSE}/M$, where M can be the size ratio of transistors P3 and P4. Using a scaled down value of current $I_{OUT}$ can reduce power consumption of current sensor 341 and current to voltage converter 342.

The value of voltage $V_{REF}$ generated by current to voltage converter 342 is function of (e.g., based on) the value of current $I_{REF}$ and resistor $R_{REF}$ and the value of a voltage (e.g., $V_D$) across diode D. The value of voltage $V_{REF}$ can be less than the value of voltage $V_{IN}$ (e.g., $V_{REF} < V_{IN}$). Diode D can have the same structure as diode D1, D2, and D3 (e.g., the same as the charge transfer switch of charge pump 310). This helps reduce the influence of the process technology and temperature on the feedback mechanism (e.g., monitor circuit that includes voltage converter 342). Current source 343 is included in voltage generator 301 to provide a current through resistor $R_{REF}$ and diode D. The inclusion of current source 343 ensures that equation (1) satisfies the following condition.

$$[C/(C+Cs)]*V_{PH}-V_D>0 \qquad (9)$$

Satisfying the condition as shown in equation (9) allows voltage $V_{REF}$ to be at a safe level in order to maintain proper functionality of charge pump 310.

Phase supply voltage controller 330 can include a voltage follower output circuit (e.g., included in operational amplifier 331) to generate voltage $V_{PH}$ based on voltage $V_{REF}$ (e.g., $V_{PH}=V_{REF}$). As shown in FIG. 3, voltage $V_{PH}$ can be provided to switching circuit 311 (e.g., provided to the sources of transistors P1 and P2) of charge pump 310 and can be used as supply voltage for switching circuit 311. As described above, the value of voltage $V_{PH}$ can be adjusted based on the value of current $I_{OUT}$ (e.g., the value of voltage $V_{PH}$ is reduced when the value of current $I_{OUT}$ decreases) in order improve the efficiency and quality of voltage $V_{OUT}$ of charge pump 310. Voltage generator 301 of FIG. 3 can include improvements and benefits similar to those of voltage generator 101 described above with reference to FIG. 1 and FIG. 2.

Figure 4:
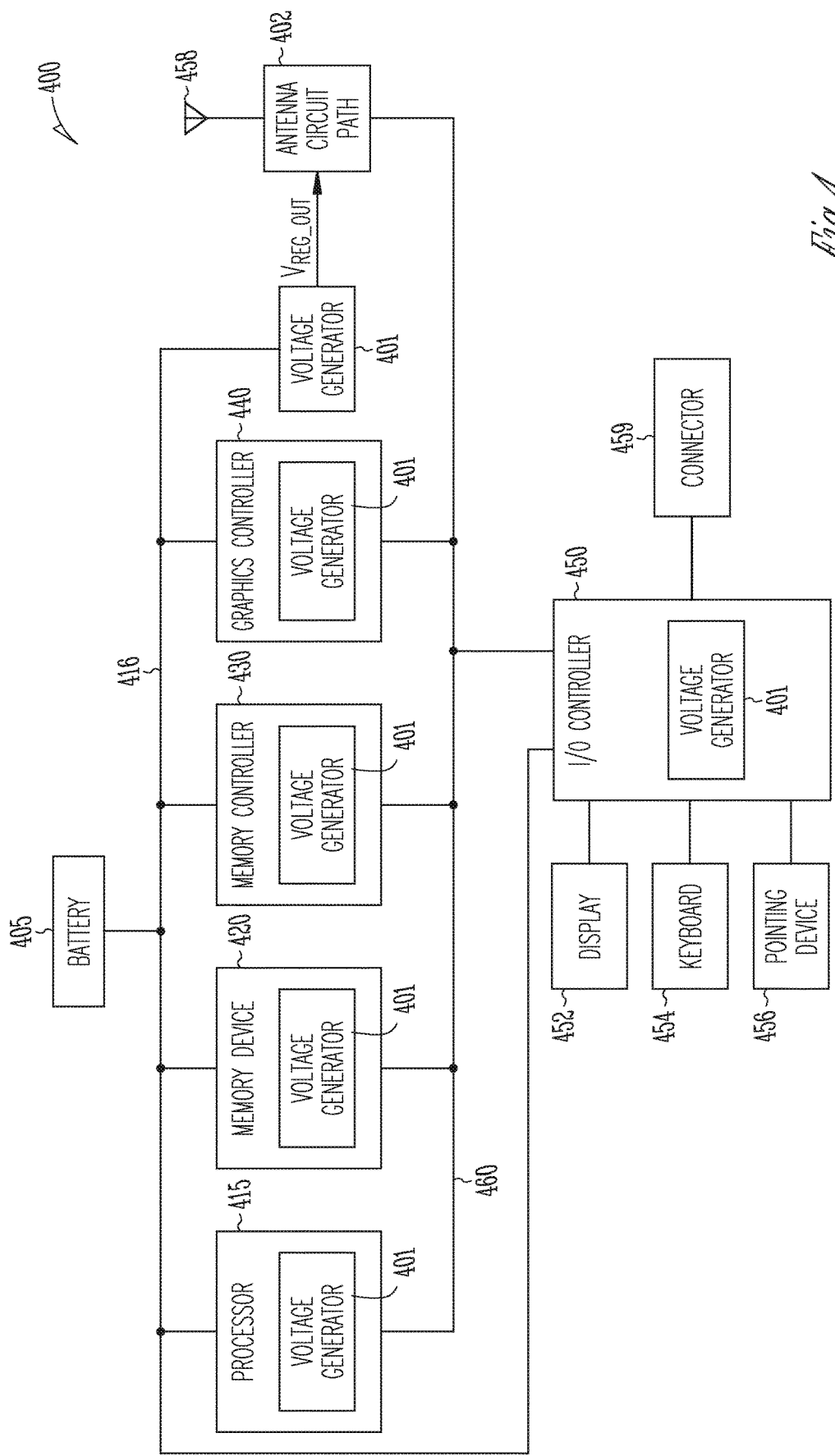
FIG. 4 shows an apparatus in the form an electronic system, according to some embodiments described herein.

FIG. 4 shows an apparatus in the form of a system (e.g., electronic system) 400, according to some embodiments described herein. System 400 can include or be included in a computer, a tablet, or other electronic systems. As shown in FIG. 4, system 400 can include components such as a battery 405, a processor 415, a memory device 420, a memory controller 430, a graphics controller 440, an input and output (I/O) controller 450, a display 452, a keyboard 454, a pointing device 456, at least one antenna 458 and an antenna circuit path (e.g., antenna signal path) 402, a connector 459, and a bus 460. Bus 460 can include conductive lines (e.g., metal-based traces on a circuit board where the components of system 400 are located).

In some arrangements, system 400 does not have to include a display. Thus, display 452 can be omitted from system 400. In some arrangements, system 400 does not have to include any antenna. Thus, antenna 458 can be omitted from system 400.

Battery 405 can provide power to the components of system 400, (e.g., through a power delivery path 416) such as to processor 415, memory device 420, memory controller 430, graphics controller 440, and I/O controller 450.

Processor 415 can include a general-purpose processor or an application specific integrated circuit (ASIC). Processor 415 can include a CPU.

Memory device 420 can include a dynamic random-access memory (DRAM) device, a static random-access memory (SRAM) device, a flash memory device, a phase change memory device, a combination of these memory devices, or other types of memory. FIG. 4 shows an example where memory device 420 is a stand-alone memory device separated from processor 415. In an alternative arrangement, memory device 420 and processor 415 can be located on the same die. In such an alternative arrangement, memory device 420 is an embedded memory in processor 415, such as embedded DRAM (eDRAM), embedded SRAM (eSRAM), embedded flash memory, or another type of embedded memory.

Display 452 can include a liquid crystal display (LCD), a touchscreen (e.g., capacitive or resistive touchscreen), or another type of display. Pointing device 456 can include a mouse, a stylus, or another type of pointing device.

I/O controller 450 can include a communication module for wired or wireless communication (e.g., communication through one or more antennas 458). Such wireless communication may include communication in accordance with WiFi communication technique, Long Term Evolution Advanced (LTE-A) communication technique, or other communication techniques.

I/O controller 450 can also include a module to allow system 400 to communicate with other devices or systems in accordance with one or more standards or specifications (e.g., I/O standards or specifications), including Universal Serial Bus (USB), DisplayPort (DP), High-Definition Multimedia interface (HIM), Thunderbolt, Peripheral Component Interconnect Express (PCIe), Ethernet, and other specifications.

Connector 459 can be arranged (e.g., can include terminals, such as pins) to allow system 400 to be coupled to an external device (or system). This may allow system 400 to communicate (e.g., exchange information) with such a device (or system) through connector 459.

Connector 459 and at least a portion of bus 460 can include conductive lines that conform with at least one of USB, DP, HDMI, Thunderbolt, PCIe, Ethernet, and other specifications.

As shown in FIG. 4, each of processor 415, memory device 420, memory controller 430, graphics controller 440, and I/O controller 450 can include a voltage generator 401. Voltage generator 401 can include voltage generator 101 and voltage generator 301 described above with reference to FIG. 1 through FIG. 3. Thus, voltage generator 401 can include a charge pump, an output regulator, a phase supply voltage controller, and a monitor circuit that includes a current sensor and a current to voltage converter described above with reference to FIG. 1 through FIG. 3.

As shown in FIG. 4, system 400 can also include voltage generator 401 to provide a voltage $V_{REG\_OUT}$ to antenna circuit path 402. Antenna circuit path 402 can include transistors (not shown) that can operate as switches to control signals (e.g., signals received from antenna 458) on antenna circuit path 402. Voltage $V_{REG\_OUT}$ provided antenna circuit path 402 can be used to control the gates of the transistors of antenna circuit path 402, to provide voltage to the bulks of the transistors of antenna circuit path 402, or both. Using voltage $V_{REG\_OUT}$ from voltage generator 401 to control signals (control the propagation of signals) in antenna circuit path 402 can avoid injection of noise into antenna circuit path 402. Thus, signal integrity on antenna circuit path 402 can be maintained.

FIG. 4 shows an example where each of processor 415, memory device 420, memory controller 430, graphics controller 440, and 110 controller 450 includes voltage generator 401. However, in some arrangements, some of processor 415, memory device 420, memory controller 430, graphics controller 440, and I/O controller 450 may not include generator 401.

FIG. 4 shows the components of system 400 arranged separately from each other as an example. For example, each of antenna circuit path 402, processor 415, memory device 420, memory controller 430, graphics controller 440, and I/O controller 450 can be located separately in system 400. For example, each of these components can be located on an integrated circuit (IC) (e.g., semiconductor die or an IC chip). In some arrangements, two or more components (e.g., antenna circuit path 402, processor 415, memory device 420, graphics controller 440, and I/O controller 450) of system 400 can be located on the same die (e.g., same IC chip) that forms a system-on-chip (SoC) or located on the same IC package that forms a system-on-package (SoP) or system-in-package (SiP).

The illustrations of the apparatuses (e.g., apparatuses 100 and 300 and system 400 including voltage generators 101, 301, and 401) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a first node to receive a first supply voltage, a second node receive a second supply voltage, a third node to receive a clock signal, a charge pump coupled the first, second, and third nodes to generate an output voltage based on the first supply voltage, the second supply voltage, and timing of the clock signal, an output regulator to generate a voltage at a node based on the output voltage, and a monitor circuit to monitor an output current at the node and provide feedback information based on the output current to adjust a value of the second supply voltage In Example 2, the subject matter of Example 1 may optionally include, wherein the monitor circuit is to generate a reference current based on the output current, and the feedback information includes a reference voltage generated based on the reference current.

In Example 3, the subject matter of Example 1 or 2 may optionally include, further comprising a controller to adjust the value of the second supply voltage based on a value of the reference voltage.

In Example 4, the subject matter of Example 1 or 2 may optionally include, wherein the charge pump includes an output node to provide the output voltage, and at least one diode coupled between the first node and the output node.

In Example 5, the subject matter of Example 4 may optionally include, wherein the charge pump includes a driver coupled between the second node and ground.

In Example 6, the subject matter of Example 5 may optionally include, wherein the driver includes transistors having gates coupled to the third node.

In Example 7, the subject matter of Example 1 may optionally include, wherein a value of the second supply voltage is less than a value of the first supply voltage.

Example 8 includes subject matter (such as a device, an electronic apparatus (e.g., circuit, electronic system, or both), or a machine) including a charge pump to generate an output voltage at an output node based on a first voltage, the charge pump including a switching circuit to control generation of the output voltage based on timing of a clock signal, the switching circuit including a node to receive a second voltage, an output regulator to generate a regulated output voltage based on the output voltage and provide the regulated output voltage at a regulator output node, a current sensor to generate a reference current based on an output current at the regulator output node, a converter to convert the reference current into a reference voltage, and a controller to control the second voltage based on the reference voltage.

In Example 9, the subject matter of Example 8 may optionally include, wherein the charge pump includes an input node to receive the first voltage, and diodes connected in series between the input and output nodes.

In Example 10, the subject matter of Example 9 may optionally include, wherein the charge pump includes a driver coupled to the node of the switching circuit, and a capacitor coupled between one of the diodes and an output node of the driver.

In Example 11, the subject matter of Example 10 may optionally include, wherein the charge pump includes an additional driver coupled to the node of the switching circuit, and an additional capacitor coupled between one of the diodes and an output node of the additional driver.

In Example 12, the subject matter of Example 11 may optionally include, wherein each of the driver and the additional driver includes transistors having gates to receive the clock signal.

In Example 13, the subject matter of any of Examples 8-12 may optionally include, wherein the current sensor includes a first transistor and a second transistor coupled between the output node of the charge pump and the regulator output node.

In Example 14, the subject matter of any of Examples 8-12 may optionally include, wherein the converter includes a transistor, a resistor, and a diode coupled between the output node of the charge pump and ground.

In Example 15, the subject matter of Example 14 may optionally include, wherein the charge pump includes an input node to receive the first voltage, and the converter includes a current source coupled between the input node and the resistor.

In Example 16, the subject matter of Example 8 may optionally include, wherein the controller includes a voltage follower circuit to adjust a value of the second voltage based on a value of the reference voltage.

Example 17 includes subject matter (such as a device, an electronic apparatus (e.g., circuit, electronic system, or both), or a machine) including an antenna circuit path, and a voltage generator coupled to the antenna circuit path, the voltage generator including a first node to receive a first supply voltage, a second node receive a second supply voltage, a third node to receive a clock signal, a charge pump coupled to the first, second, and third nodes to generate an output voltage based on the first supply voltage, the second supply, and timing of the clock signal, an output regulator to generate a voltage at a node based on the output voltage, and a monitor circuit to monitor an output current at the node and provide feedback information based on the output current to adjust a value of the second supply voltage.

In Example 18, the subject matter of Example 17 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

In Example 19, the subject matter of Example 17 or 18 may optionally include, further comprising a processor coupled to the antenna circuit path.

In Example 20, the subject matter of Example 17 or 18 may optionally include, further comprising a display coupled to the antenna circuit path.

The subject matter of Example 1 through Example 20 may be combined in any combination.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first node to receive a first supply voltage;
a second node receive a second supply voltage;
a third node to receive a clock signal;
a charge pump coupled the first, second, and third nodes to generate an output voltage at an output node based on the first supply voltage, the second supply voltage, and timing of the clock signal;
an output regulator to generate a voltage at a node based on the output voltage; and
a monitor circuit to monitor an output current at the node and provide feedback information based on the output current to adjust a value of the second supply voltage, the monitor circuit including a first transistor and a second transistor coupled between the output node and the node.

2. The apparatus of claim 1, wherein the monitor circuit is to generate a reference current based on the output current, and the feedback information includes a reference voltage generated based on the reference current.

3. The apparatus of claim 1, further comprising a controller to adjust the value of the second supply voltage based on a value of the reference voltage.

4. The apparatus of claim 1, wherein the charge pump includes at least one diode coupled between the first node and the output node.

5. The apparatus of claim 4, wherein the charge pump includes a driver coupled between the second node and ground.

6. The apparatus of claim 5, wherein the driver includes transistors having gates coupled to the third node.

7. The apparatus of claim 1, wherein a value of the second supply voltage is less than a value of the first supply voltage.

8. An apparatus comprising:
a charge pump to generate an output voltage at an output node based on a first voltage, the charge pump including a switching circuit to control generation of the output voltage based on timing of a clock signal, the switching circuit including a node to receive a second voltage:
an output regulator to generate a regulated output voltage based on the output voltage and provide the regulated output voltage at a regulator output node;
a current sensor to generate a reference current based on an output current at the regulator output node;
a converter to convert the reference current into a reference voltage; and
a controller to control the second voltage based on the reference voltage, wherein the current sensor includes a first transistor and a second transistor coupled between the output node of the charge pump and the regulator output node.

9. The apparatus of claim 8, wherein the charge pump includes:
an input node to receive the first voltage; and
diodes connected in series between the input and output nodes.

10. The apparatus of claim 9, wherein the charge pump includes:
a driver coupled to the node of the switching circuit; and
a capacitor coupled between one of the diodes and an output node of the driver.

11. The apparatus of claim 10, wherein the charge pump includes:
an additional driver coupled to the node of the switching circuit; and
an additional capacitor coupled between one of the diodes and an output node of the additional driver.

12. The apparatus of claim 11, wherein each of the driver and the additional driver includes transistors having gates to receive the clock signal.

13. An apparatus comprising:
a charge pump to generate an output voltage at an output node based on a first voltage, the charge pump including a switching circuit to control generation of the output voltage based on timing of a clock signal, the switching circuit including a node to receive a second voltage;
an output regulator to generate a regulated output voltage based on the output voltage and provide the regulated output voltage at a regulator output node;
a current sensor to generate a reference current based on an output current at the regulator output node;
a converter to convert the reference current into a reference voltage; and
a controller to control the second voltage based on the reference voltage, wherein the converter includes a transistor, a resistor, and a diode coupled between the output node of the charge pump and ground.

14. The apparatus of claim 13, wherein the charge pump includes an input node to receive the first voltage, and the converter includes a current source coupled between the input node and the resistor.

15. An apparatus comprising:
a charge pump to generate an output voltage at an output node based on a first voltage, the charge pump including a switching circuit to control generation of the output voltage based on timing of a clock signal, the switching circuit including a node to receive a second voltage;
an output regulator to generate a regulated output voltage based on the output voltage and provide the regulated output voltage at a regulator output node;
a current sensor to generate a reference current based on an output current at the regulator output node;
a converter to convert the reference current into a reference voltage; and
a controller to control the second voltage based on the reference voltage, wherein the controller includes a voltage follower circuit to adjust a value of the second voltage based on a value of the reference voltage.

16. An electronic system comprising:
an antenna circuit path; and
a voltage generator coupled to the antenna circuit path, the voltage generator including:
a first node to receive a first supply voltage;
a second node receive a second supply voltage;
a third node to receive a clock signal;
a charge pump coupled to the first, second, and third nodes to generate an output voltage at an output node based on the first supply voltage, the second supply, and timing of the clock signal;
an output regulator to generate a voltage at a node based on the output voltage; and
a monitor circuit to monitor an output current at the node and provide feedback information based on the output current to adjust a value of the second supply voltage, the monitor circuit including a first transistor and a second transistor coupled between the output node and the node.

17. The apparatus of claim 16, further comprising a connector coupled to the voltage generator, the connector conforming with one of Universal Serial Bus (USB), High-Definition Multimedia Interface (HDMI), Thunderbolt, Peripheral Component Interconnect Express (PCIe), and Ethernet specifications.

18. The system of claim 16, further comprising a processor coupled to the antenna circuit path.

19. The system of claim 16, further comprising a display coupled to the antenna circuit path.

* * * * *